United States Patent
Kato et al.

(10) Patent No.: US 8,992,682 B2
(45) Date of Patent: Mar. 31, 2015

(54) GRAPHITE CRUCIBLE AND SILICON SINGLE CRYSTAL MANUFACTURING APPARATUS

(75) Inventors: Hideo Kato, Yamaguchi (JP); Hideaki Murakami, Hikari (JP); Mikio Suehiro, Syuunan (JP)

(73) Assignee: Siltronic AG, Munich (DE)

( * ) Notice: Subject to any disclaimer, the term of this patent is extended or adjusted under 35 U.S.C. 154(b) by 1190 days.

(21) Appl. No.: 12/913,957

(22) Filed: Oct. 28, 2010

(65) Prior Publication Data

US 2011/0139064 A1 Jun. 16, 2011

(30) Foreign Application Priority Data

Dec. 11, 2009 (JP) .................. 2009-281808

(51) Int. Cl.
*C30B 15/10* (2006.01)
*C30B 15/12* (2006.01)
*C30B 35/00* (2006.01)

(52) U.S. Cl.
CPC ............. *C30B 15/10* (2013.01); *C30B 15/12* (2013.01); *C30B 35/002* (2013.01)
USPC ............. 117/213; 117/208; 117/31; 422/557; 422/245.1; 422/908; 65/134.7; 65/405; 65/502

(58) Field of Classification Search
CPC ........ C30B 15/10; C30B 15/12; C30B 35/002
USPC ............... 117/213, 208; 422/557, 245.1, 908; 65/134.7, 405, 502
See application file for complete search history.

(56) References Cited

U.S. PATENT DOCUMENTS

2003/0070612 A1 4/2003 Addis

FOREIGN PATENT DOCUMENTS

| JP | 61044791 A | 3/1986 | |
|---|---|---|---|
| JP | 64-018987 A | 1/1989 | |
| JP | 10297992 A | 11/1998 | |
| JP | 2000044381 A | * 2/2000 | ............. C30B 15/10 |
| JP | 2008201619 A | 9/2008 | |
| WO | 02072926 A1 | 9/2002 | |

* cited by examiner

*Primary Examiner* — Michael Kornakov
*Assistant Examiner* — Hua Qi
(74) *Attorney, Agent, or Firm* — Brooks Kushman P.C.

(57) ABSTRACT

A graphite crucible for silicon single crystal manufacturing by the Czochralski method, having a long life cycle, contains at least one gas venting hole provided in a corner portion of the crucible. Gas generated by reaction between the graphite crucible and a quartz crucible is released to the outside through the gas venting hole, and formation of SiC on the surface of the graphite crucible and deformation of the quartz crucible caused by the pressure of the generated gas are prevented.

9 Claims, 1 Drawing Sheet

GRAPHITE CRUCIBLE AND SILICON SINGLE CRYSTAL MANUFACTURING APPARATUS

CROSS-REFERENCE TO RELATED APPLICATIONS

This application claims priority to Japanese Patent Application No. JP 2009-281808 filed Dec. 11, 2009 which is herein incorporated by reference.

BACKGROUND OF THE INVENTION

1. Field of the Invention

The present invention relates to a graphite crucible used in the manufacturing of a silicon single crystal according to the Czochralski method. It further relates to a silicon single crystal manufacturing apparatus according to the Czochralski method, comprising the graphite crucible.

2. Background Art

As one method for growing silicon single crystals, pulling methods represented by the Czochralski method (CZ method) have been generally used. Normally, an apparatus used therein has a quartz crucible for retaining the raw material silicon melt, the crucible being surrounded by a graphite crucible having an inner shape that serves to support the quartz crucible and to achieve uniform heating, and a heater for heating the melt being arranged outside thereof. Usually, the shapes of both the quartz crucible and the graphite crucible consist of a side wall having an approximately cylindrical shape and an appropriately radially chamfered bottom portion.

In the CZ method, a silicon raw material placed in the quartz crucible is heated and melted. Since the melting point of silicon is about 1420° C., heating first has to be carried out so as to reach the melting point of silicon. In this case, the temperature of the heater has to be increased to about 1700° C., and as a result, both the graphite crucible and the quartz crucible are heated to the melting point of silicon or higher. When quartz exceeds about 1200° C., it begins to soften and deform, and, due to the load of the molten silicon in the quartz crucible, the quartz crucible comes almost entirely into close contact with the inner shape of the graphite crucible supporting the quartz crucible from the outside. Along with a recent increase in the diameter of silicon wafers, an increase in the diameter and capacity of quartz crucibles is required in the CZ method as well, and it is becoming more important to control the temperature range and heating uniformity of the heating process.

As shown in the equations below, a known problem of the CZ method is that, at the silicon melting temperature, a reaction is generated on the inner surface of the quartz crucible between $SiO_2$, which is a component of the quartz crucible, and the molten silicon Si. As a result, an SiO gas is generated. Furthermore, outside of the quartz crucible, this SiO gas reacts with the outer surface of the graphite member, thereby forming an SiC solid. Moreover, on the outer surface of the quartz crucible, a SiO gas and a CO gas are generated by a reaction between the outer surface of the quartz crucible and the inner surface of the graphite crucible, and further SiC solids are formed by reaction with the inner surface of the graphite crucible. The SiC thus formed has a thermal expansion coefficient significantly different from that of graphite. Therefore, SiC becomes a cause of cracks, etc. during the cooling/heating cycle of the graphite crucible, thus limiting its service life in terms of safety, etc. Moreover, CO gas generated during this process applies a pressure to the quartz crucible, causing it to deform.

$SiO_2 + Si \rightarrow SiO$ $SiO_2 + C \rightarrow SiO + CO$ $SiO + 2C \rightarrow SiC + CO$ Several techniques directed to improving the graphite crucible in order to solve the above problems are known. One of them is a method disclosed in Japanese Patent Application Laid Open No. 61-44791, in which the CO gas generated between the quartz crucible and the graphite crucible is discharged by flowing an inert gas such as argon in a downstream direction between the quartz crucible and the graphite crucible and discharging the gas through holes which are provided with a downward direction in a lower part of the side surface of the graphite crucible. Moreover, a technique in which horizontal holes are provided in the graphite crucible at positions above the liquid level of the molten silicon in order to prevent deformation of the quartz crucible caused by the generated gas is disclosed in Japanese Patent Application Laid Open No. 10-297992. Furthermore, a method in which the CO gas generated between the quartz crucible and the graphite crucible is discharged by flowing an inert gas such as argon in a downstream direction toward a bottom portion of the crucible along gas guiding grooves which are provided vertically on the inner surface of the graphite crucible and discharging the gas from the bottom portion is disclosed in Japanese Patent Application Laid Open No. 2008-201619.

However, it has now begun to be recognized that these conventional methods are no longer adequate for the large-diameter/large-capacity (high weight) quartz crucibles which are, particularly recently, used in the CZ method. More specifically, providing complicated structures, such as gas guiding grooves, on the inner surface of the graphite crucible in order to discharge the generated gas is not preferred in terms of safe retention of the large-capacity (high weight) quartz crucible. Moreover, when a quartz crucible having a large diameter/large capacity (high weight) is used, the quartz crucible softened due to the high heating temperature deforms so that it almost entirely comes into close contact with the graphite crucible supporting it. Thus, it becomes difficult to provide a sufficient gas flow between the crucibles.

Therefore, novel graphite crucible technologies which prevent accumulation of pressure on the quartz crucible by smoothly discharging the generated CO gas and also prevent formation/accumulation of SiC on the inside of the graphite crucible, both without (i) providing a complicated structure on the inner surface of the graphite crucible and without (ii) providing a sufficient inert gas flow between the graphite crucible and the quartz crucible, are desired.

SUMMARY OF THE INVENTION

The present inventors have diligently carried out research in order to develop a graphite crucible that addresses the problems of prior art graphite crucibles. As a result, the inventors succeeded in finding a novel graphite crucible in which at least one approximately horizontal gas venting hole is provided at least one particular position on the graphite crucible, due to which pressure does not accumulate on the surface of the quartz crucible thanks to a smooth discharge of the generated CO gas, and formation/accumulation of SiC on the inside of the graphite crucible is prevented. Thus, the present invention is accomplished. Specifically, the present invention relates to a graphite crucible used in the manufacture of a silicon single crystal according to the Czochralski method, characterized in that at least one gas venting hole is provided in a corner portion of the graphite crucible.

DETAILED DESCRIPTION OF THE PREFERRED EMBODIMENT(S)

The present invention also relates to a graphite crucible characterized in that the direction of the at least one gas venting hole is approximately horizontal, and to a silicon single crystal manufacturing apparatus according to the Czochralski method, characterized in that it comprises the graphite crucible of the present invention.

Here, the graphite crucible of the present invention includes not only the divided type but also the one-piece type. Furthermore, the present invention also includes a crucible made of CFC composite (carbon fiber reinforced carbon).

In the graphite crucible according to the present invention, the at least one gas venting hole is provided in the corner portion of the crucible. Therefore, the graphite crucible is capable of smoothly releasing the gas generated by the reaction between the quartz crucible and the graphite crucible, thereby preventing formation of SiC on the surface of the graphite crucible and deformation of the quartz crucible caused by the gas pressure. Since the silicon single crystal manufacturing apparatus according to the Czochralski method of the present invention comprises the graphite crucible according to the present invention, during silicon single crystal manufacturing, the gas generated by the reaction between the quartz crucible and the graphite crucible can be smoothly released. Thereby, formation of SiC on the surface of the graphite crucible and deformation of the quartz crucible caused by the gas pressure can be prevented, ensuring safety in manufacturing, and extending the life cycle of the graphite crucible.

Figure 1:
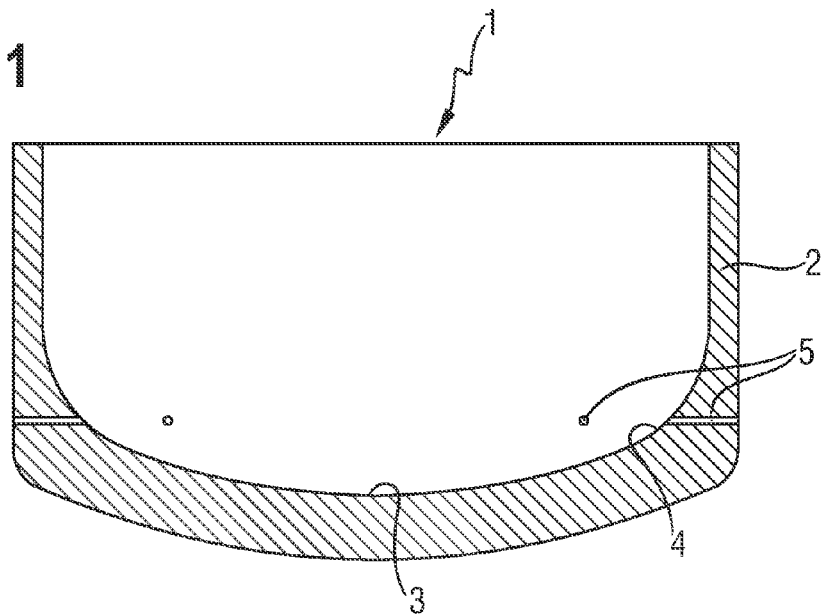
FIG. 1 shows a graphite crucible of the present invention.

As illustrated by an example of a graphite crucible 1 of the present invention shown in FIG. 1, in the graphite crucible of the present invention, a (inner) side portion 2 usually has an approximately perpendicular cylindrical shape and a bottom portion 3 an appropriately radially chamfered shape. A characteristic of the graphite crucible resides in that gas venting holes 5 are provided in a corner portion 4 thereof. Here, the graphite crucible 1 may be basically the same as conventional publicly known graphite crucibles used in the manufacturing of silicon single crystals according to the Czochralski method, and there are no particular limitations imposed on whether said graphite crucible is a divided type or an one-piece type, and no particular limitations regarding its size, shape, or material. The crucible regarded as one unit has the shape described above during usage, even in the case of the conventional divided type, where the crucible is divided into two or three parts. Here, the corner portion of the graphite crucible of the present invention means the part (region) connecting the side portion and the bottom portion. The graphite crucible of the present invention has a function of supporting a major load of a quartz crucible and molten silicon with its corner portion during usage. Since the quartz crucible is heated during usage to about its softening point, the quartz crucible is caused to be in a state in which it almost entirely comes into close contact with the graphite crucible at the bottom portion and the corner portion, and a desired heating effect is achieved. The gas venting holes 5 are provided as approximately horizontal holes in the corner portion from inside to outside of the graphite crucible.

Figure 2:
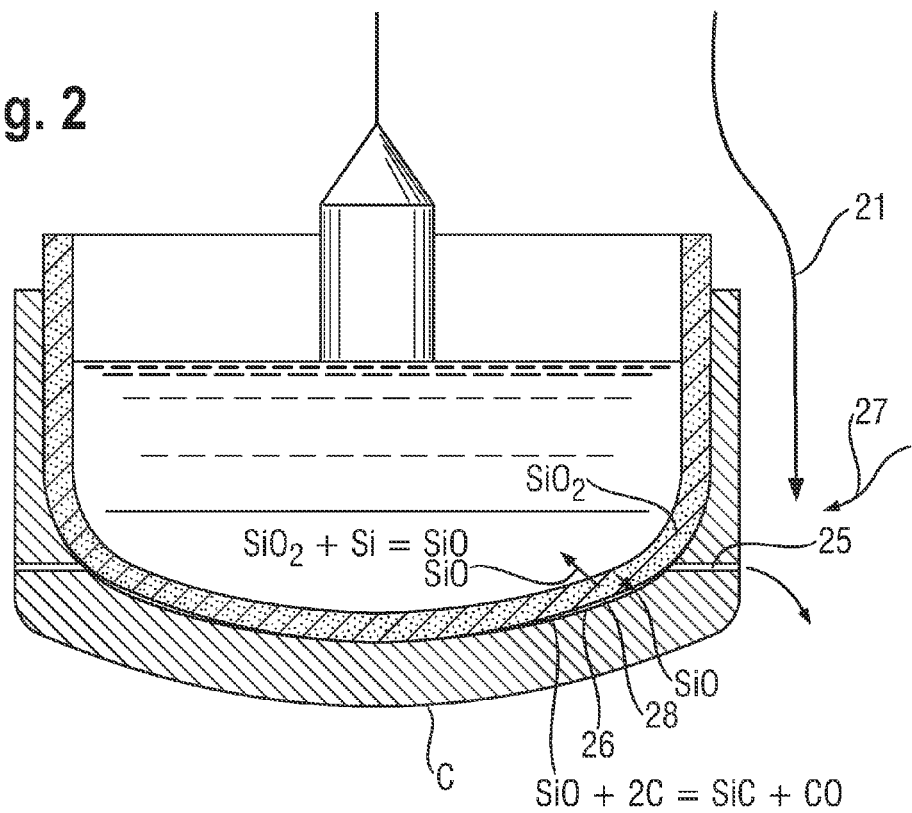
FIG. 2 is a drawing explaining the effects of gas venting holes of the present invention.

As schematically shown in FIG. 2, during usage, an inert gas 21, usually argon gas and usually under reduced pressure, is flowed outside of the graphite crucible and discharged. Therefore, the pressure of the inside 26 of the gas venting holes 25 and the gap 28 is at a state in which it is somewhat lower than the outside pressure 27 of the graphite crucible. Thus, as explained above, a CO gas is formed during usage due to the reaction between an SiO gas and C of the surface of the graphite crucible during the short period of time until the SiO gas reaches the gas venting holes. However, the gas is quickly discharged from the gas venting holes, and accumulation of pressure applied to the quartz crucible can be prevented. Therefore, the reaction of SiO and the surface of the graphite crucible mainly takes place in the gas venting holes or in their outside peripheries alone.

In the present invention, the positions, shapes, number, and directions of the gas venting holes provided in the corner portion are not particularly limited, as long as the effects described above is carried out sufficiently. On the other hand, since the graphite crucible has to safely support the load of the quartz crucible and the molten silicon, in comprehensive consideration of the above, the positions, shapes, number, and directions of the gas venting holes can be selected to be in a preferred range. Particularly, regarding the directions of the gas venting holes, it is preferable to provide gas venting holes with a horizontal direction in order to more smoothly discharge the generated CO gas in a case when the interior of the furnace is filled with an inert gas such as argon.

Specifically, when a plurality of gas venting holes is provided, the positions thereof are preferred to be positions that equally divide the cylindrical corner portion. In the case of equally dividing positions, the decrease of crucible strength caused by the holes can be minimized. The shapes of the gas venting holes are not particularly limited, and circular shapes and polygonal shapes can be employed. The cross sectional areas thereof are also not particularly limited. However, the cross sectional area can be selected in sufficient consideration of how the quartz wall of the quartz crucible heated to about its softening point can be prevented from deforming in the directions of the gas venting holes. Therefore, in consideration thereof, the cross sectional area of each gas venting hole is preferred to be 225 mm$^2$ or less. This means that, if the cross section is circular, the radius thereof is preferred to be in the range of 5 mm to 8 mm. When gas venting holes having this cross sectional area are employed, the number of the gas venting holes is preferably in the range of 2 to 3/crucible with division, and 6 to 8/crucible without division, i.e. one part crucibles.

The directions of the gas venting holes are not particularly limited. However, the gas venting holes are preferred to be provided in directions with which the above-explained process, in other words, the smooth discharging of the CO gas generated between the quartz crucible and the graphite crucible, can be carried out. Specifically, providing the gas venting holes approximately horizontally or somewhat upwardly is preferred since this brings about a smooth gas flow.

A silicon single crystal manufacturing apparatus according to the Czochralski method of the present invention is characterized in that it comprises the graphite crucible of the present invention instead of a graphite crucible used in a conventionally known apparatus. Thus, under conventional manufacturing conditions, the CO gas generated between the quartz crucible and the inventive graphite crucible is quickly discharged from the gas venting holes of the graphite crucible to the outside. As a result, formation and accumulation of SiC on the inside of the graphite crucible can be suppressed, and deformation of the quartz crucible due to the accumulated pressure of the CO gas can be suppressed.

EXAMPLE

50 Silicon ingots were pulled up by using a graphite crucible having an outer diameter of 500 mm and an inner diameter of 460 mm having horizontal holes with an inner diameter of 5 mm spaced equally at six locations in the corner portion of the crucible. No deposition of SiC on the inside of the crucible could be confirmed at all. However, in the peripheries of the holes on the outside of the crucible, SiC deposition of about 3 mm was confirmed. Furthermore, no deformation of the quartz crucible due to CO gas was observed.

The graphite crucible according to the present invention can be utilized in silicon single crystal manufacturing apparatuses according to the Czochralski method.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A graphite crucible for the manufacture of a silicon single crystal by the Czochralski method, comprising:
a wall portion, a bottom portion, and a corner portion connecting the wall portion and the bottom portions, and
at least one gas venting hole provided in the corner portion of the graphite crucible, wherein the at least one gas venting hole is provided in a direction which is approximately horizontally or inclined upwardly, and the at least one gas venting hole has a cross-sectional area of 225 $mm^2$ or less.

2. The graphite crucible of claim 1, wherein a plurality of 3 to 8 gas venting holes, consisting of holes having a cross-sectional area of 225 $mm^2$ or less are provided in the corner portion of the graphite crucible.

3. The graphite crucible of claim 1, wherein the at least one gas venting hole has a radius of from 5 to 8 mm.

4. The graphite crucible of claim 1, wherein the graphite crucible is divided into two or three parts, and contains two to three gas venting holes.

5. The graphite crucible of claim 1 which is a one-part crucible, and has from 6 to 8 gas venting holes.

6. The graphite crucible of claim 4, wherein the gas venting holes are equally spaced around the corner portion.

7. The graphite crucible of claim 5, wherein the gas venting holes are equally spaced around the corner portion.

8. A silicon single crystal manufacturing apparatus according to the Czochralski method, comprising the graphite crucible according to claim 1.

9. A silicon single crystal manufacturing apparatus according to the Czochralski method, comprising the graphite crucible according to claim 2.

* * * * *